(12) United States Patent
Hong (10) Patent No.: US 11,630,134 B2
(45) Date of Patent: Apr. 18, 2023

(54) RAPID SENSING VALUE ESTIMATION CIRCUIT AND METHOD THEREOF

(71) Applicant: ANPEC ELECTRONICS CORPORATION, Hsinchu (TW)

(72) Inventor: Jia-Hua Hong, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 330 days.

(21) Appl. No.: 17/035,984

(22) Filed: Sep. 29, 2020

(65) Prior Publication Data

US 2021/0405095 A1 Dec. 30, 2021

(30) Foreign Application Priority Data

Jun. 24, 2020 (TW) .................................. 109121625

(51) Int. Cl.
*G01R 19/165* (2006.01)
*H03F 3/45* (2006.01)

(52) U.S. Cl.
CPC ............. *G01R 19/16576* (2013.01); *H03F 3/45475* (2013.01); *H03F 2200/129* (2013.01); *H03F 2203/45116* (2013.01)

(58) Field of Classification Search
CPC .......... G01R 19/16576; G01R 19/1659; H03F 3/45475; H03F 2200/129; H03F 2203/45116; H03F 2203/45512; H03F 3/087; H03F 3/68; G06M 1/272; H03K 25/00
See application file for complete search history.

(56) References Cited

U.S. PATENT DOCUMENTS 10,778,238 B1 * 9/2020 Chun .................. H03M 1/0607
11,085,818 B1 * 8/2021 Hong ........................ G01J 1/44

* cited by examiner

*Primary Examiner* — Jung Kim
(74) *Attorney, Agent, or Firm* — Li & Cai Intellectual Property (USA) Office (57) ABSTRACT

A rapid sensing value estimation circuit and a method thereof are provided. The circuit includes a first sensing unit, an integration sensing circuit and a rapid estimation circuit. The rapid estimation circuit includes a clock generator, a second counter, a first digital comparator, an arithmetic module and a remainder calculation module. The clock generator generates a clock signal with a first frequency. The second counter counts the clock signal within the integration time to generate a second count value. The first digital comparator determines whether the second count value exceeds a first predetermined count value when the first count value increases. The arithmetic module calculates an estimated count value result and a remainder, and the remainder calculation module can further calculate and estimate values of decimal places of this signal based on the remainder.

14 Claims, 3 Drawing Sheets

RAPID SENSING VALUE ESTIMATION CIRCUIT AND METHOD THEREOF

CROSS-REFERENCE TO RELATED PATENT APPLICATION

This application claims the benefit of priority to Taiwan Patent Application No. 109121625, filed on Jun. 24, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to rapid sensing value estimation circuit and method thereof, and more particularly to rapid sensing value estimation circuit and method thereof that can save time for an integration sensing circuit of a sensor to perform integration operations.

BACKGROUND OF THE DISCLOSURE

In existing light sensors, when an original sensing signal exceeds a set reference voltage value within an integration time, an integrator is reset, and a digital signal with a high level signal state is output through a comparator to be accumulated by a counter. After the integration time elapsed, a digital value corresponding to an optical signal during the integration time can be obtained by reading a value of the counter, which represents that a sensing process of a light-to-digital sensor is completed.

However, under certain conditions, due to change in external signals are small, speeds at which the original sensing signals reaching the reference voltage value are not much different, but the corresponding digital result needs to be obtained in a complete integration time, resulting in an increase in costs of time. Furthermore, a resolution of the digital result generated is limited by capabilities of the counter.

Therefore, providing a rapid sensing value estimation manner that can estimate the integration result in advance to save time and cost, while improving the resolution of the original sensing signal has become an important topic in the art.

SUMMARY OF THE DISCLOSURE

In response to the above-referenced technical inadequacies, the present disclosure provides rapid sensing value estimation circuit and method thereof that can save integration operation time and cost, while improving overall signal resolution.

In one aspect, the present disclosure provides a rapid sensing value estimation circuit, including a first sensing unit, an integration sensing circuit and a rapid estimation circuit. The first sensing unit is configured to perform sensing to generate a first sensing signal. The integration sensing circuit is electrically connected to the first sensing unit and includes an operational amplifier, a comparator and a first counter. A first input terminal of the operational amplifier is electrically connected to the first sensing unit, and connected to an output terminal of the operational amplifier through an integration capacitor, and a second input terminal of the operational amplifier is grounded. The output terminal of the operational amplifier is an integration node, and the operational amplifier receives the first sensing signal and generates an integration voltage on the integration node. A first input terminal of the comparator is electrically connected to the integration node, and a second input terminal of the comparator is electrically connected to a first reference voltage. In response to the integration voltage of the integration node exceeding the first reference voltage, the comparator is configured to generate a trigger reset signal at the output terminal of the comparator, and the trigger reset signal is used to reset the integration voltage. The first counter is configured to count the trigger reset signal within an integration time to generate a first count value and correspondingly output a first count signal. The first counter has a first maximum count value within the integration time. The rapid estimation circuit includes a clock generator, a second counter, a first digital comparator, an arithmetic module and a remainder calculation module. The clock generator is configured to generate a clock signal with a first frequency. The second counter is electrically connected to the clock generator and configured to count the clock signal within the integration time to generate a second count value, and correspondingly output a second count signal. The second counter has a second maximum count value related to the first frequency within the integration time, and the second maximum count value is greater than the first maximum count value. The first digital comparator is configured to determine whether the second count value exceeds a first predetermined count value when the first count value increases. The arithmetic module is configured to, in response to an increasing of the first count value and the first digital comparator determining that the second count value exceeds the first predetermined count value, calculate an estimated count value result and a remainder according to the second maximum count value and a ratio of the second count value to the first count value. The estimated count value result is used to estimate the first count value at an end of the integration time. The remainder calculation module is configured to, in response to the remainder being calculated by the arithmetic module, generate an estimated remainder result according to the remainder, thereby estimating a portion of the integration voltage of the integration node that has not exceeded the first reference voltage to be counted by the first counter at the end of the integration time.

In certain embodiments, the rapid sensing value estimation circuit further includes a signal amplifier connected between the first sensing unit and the integration node, and the rapid estimation circuit further includes a second digital comparator and a digital controller. The second digital comparator is configured to determine whether the first count value is zero when the second count value exceeds a second predetermined count value within the integration time and when the second count value increases. The digital controller is configured to, in response to the second digital comparator determining that the first count value is zero when the second count value exceeds the second predetermined count value, output a first control signal to control the signal amplifier to amplify the first sensing signal. The second predetermined count value is less than the first predetermined count value.

In certain embodiments, the first predetermined count value is at least greater than 2N times the first maximum count value, and N is a positive integer greater than zero.

In certain embodiments, the rapid estimation circuit further includes a status check module electrically connected to the second counter, the first digital comparator, and the second digital comparator and the digital controller, and configured to receive determination results generated by the first digital comparator and the second digital comparator, respectively, to determine to control the digital controller or the arithmetic module.

In certain embodiments, the fast estimation circuit further includes a first register, a second register, and a third register. The first register is connected to the first digital comparator and configured to store the first predetermined count value. The second register is connected to the second digital comparator and configured to store the second predetermined count value. The third register is connected to the arithmetic module and the remainder calculation module, and configured to store the estimated count value result and the estimated remainder result.

In certain embodiments, a calculation of the estimated count value result includes multiplying the second maximum count value by the first count value, and dividing by the second count value, thereby obtaining a quotient used as the estimated count value result and the remainder, and the estimated remainder result is obtained by dividing the remainder by the second count value.

In certain embodiments, the second counter is further configured to start counting the clock signal after the first count value reaches 1 after the integration time starts, to generate the second count value, and correspondingly output the second count signal. The arithmetic module is configured to, in response to the increasing of the first count value and the first digital comparator determining that the second count value exceeds the first predetermined count value, calculate the estimated count value result and the remainder according to a ratio of the second maximum count value to the second count value, and the first count value minus 1, wherein the used first count value is obtained when the second count value exceeding the first predetermined count value.

In another aspect, the present disclosure provides a rapid sensing value estimation method, comprising the following steps: configuring a first sensing unit to perform sensing to generate a first sensing signal; configuring an operational amplifier of an integration sensing circuit to receive the first sensing signal and generates an integral voltage on an integral node; configuring a comparator of the integration sensing circuit to perform a comparison on the integration voltage and a first reference voltage, and generate, in response to the integration voltage exceeding the first reference voltage, a trigger reset signal at an output terminal of the comparator, wherein the trigger reset signal is used to reset the integration voltage; configuring a first counter of the integration sensing circuit to count the trigger reset signal within an integration time to generate a first count value and correspondingly output a first count signal, wherein the first counter has a first maximum count value within the integration time; configuring a clock generator of a rapid estimation circuit to generate a clock signal having a first frequency; configuring a second counter of the rapid estimation circuit to count the clock signal within the integration time to generate a second count value, and correspondingly output a second count signal, wherein the second counter has a second maximum count value related to the first frequency within the integration time, and the second maximum count value is greater than the first maximum count value; configuring a first digital comparator of the rapid estimation circuit to determine whether the second count value exceeds a first predetermined count value when the first count value increased; configuring an arithmetic module of the rapid estimation circuit to, in response to an increasing of the first count value and the first digital comparator determining that the second count value exceeds the first predetermined count value, calculate an estimated count value result and a remainder according to the second maximum count value and a ratio of the second count value to the first count value, wherein the estimated count value result is used to estimate the first count value at an end of the integration time; and configuring a remainder calculation module to, in response to the remainder being calculated by the arithmetic module, generate an estimated remainder result according to the remainder, thereby estimating a portion of the integration voltage of the integration node that has not exceeded the first reference voltage to be counted by the first counter at the end of the integration time.

Therefore, the rapid sensing value estimation circuit and method thereof provided by the present disclosure can calculate a change trend density of an original output signal in a short time, which can estimate a result at the end of the full integration time in advance. Further, since a signal with a higher frequency is used as basis of the calculation, the calculation can be more accurate than the original architecture.

Therefore, the rapid sensing value estimation circuit and method thereof provided by the present disclosure can use an original count value result as the signal output in various applications without break a circuit structure of the original sensor and the integration sensing circuit, and can estimate results in advance under the premise of maintaining the linearity of the original architecture, while increasing a resolution of the original sensing signal. Furthermore, in addition to improving the resolution of the overall signal, the effect can be significantly improved for weaker input signals.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 1:
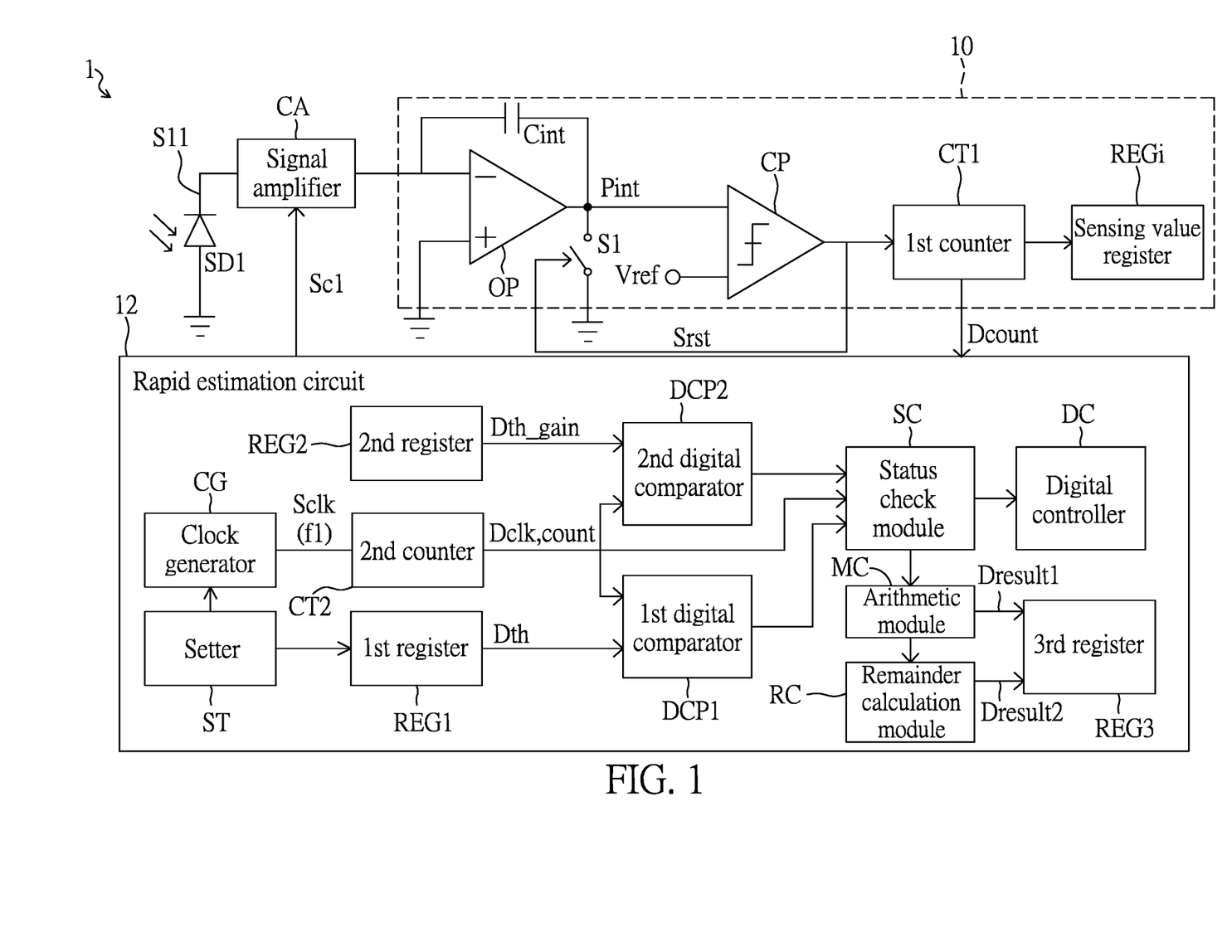
FIG. 1 is a circuit layout of a rapid sensing value estimation circuit according to an embodiment of the present disclosure.

FIG. 1 is a circuit layout of a rapid sensing value estimation circuit according to an embodiment of the present disclosure. Reference is made to FIG. 1, and an embodiment of the present disclosure provides a rapid sensing value estimation circuit 1, including a first sensing unit SD1, an integration sensing circuit 10 and a rapid estimation circuit 12.

The first sensing unit SD1, for example, can be a photodiode, or other pressure, temperature or electronic sensors. One end of the first sensing unit SD1 is grounded, and another end of the first sensing unit SD1 can be connected to an inverting input node of an operational amplifier OP through a signal amplifier CA. After the first sensing unit SD1 performs sensing, a first sensing signal S11 is generated.

The integration sensing circuit 10 is electrically connected to the first sensing unit SD1 and includes the operational amplifier OP, an integration capacitor Cint, a comparator CP and a first counter CT1.

The inverting input terminal of the operational amplifier OP is electrically connected to the first sensing unit SD1, and is connected to the output terminal of the operational amplifier OP through the integrating capacitor Cint, and a non-inverting input terminal of the operational amplifier OP is grounded. The output terminal of the operational amplifier OP is an integration node Pint, and the operational amplifier OP receives the first sensing signal S11 to generate an integration voltage Vint on the integration node Pint.

A first input terminal of the comparator CP is electrically connected to the integration node Pint, and a second input terminal of the comparator CP is electrically connected to the first reference voltage Vref. The comparator CP can be configured to compare the integration voltage Vint of the integration node Pint to the first reference voltage Vref, and when the integration voltage Vint of the integration node Pint exceeds the first reference voltage Vref, a reset trigger signal Srst is generated at an output terminal of the comparator CP, for example, a signal with high potential. The reset trigger signal Srst can be further used to reset the integration voltage Vint of the integration node Pint. For example, the potential of the integration capacitor Cint can be reset to the ground voltage, and therefore the integration voltage Vint of the integration node Pint can be reset synchronously.

In detail, the first counter CT1 counts the reset trigger signal during the integration time Tint to generate and correspondingly output a first count value Dcount. However, limited by a reset time Trst required to reset the integration voltage Vint of the integration node Pint, the first counter CT1 has a limit of a first maximum count value within the integration time Tint, and this first maximum count value corresponds to a maximum reset frequency of the first sensing unit SD1.

For example, if the integration sensing circuit 10 is designed to provide a 10-bit first maximum count value (i.e., 0-1023) within the inherent integration time Tint, the maximum reset time Trst is designed as 1/1024 of the integration time Tint, and the present disclosure utilize a higher frequency clock signal to estimate the reset time Trst, which will be described in further detail below. When the integration time Tint elapses, the first counter CT1 can store a cumulatively generated first count value Dcount' into the sensing value register REGi.

Figure 2:
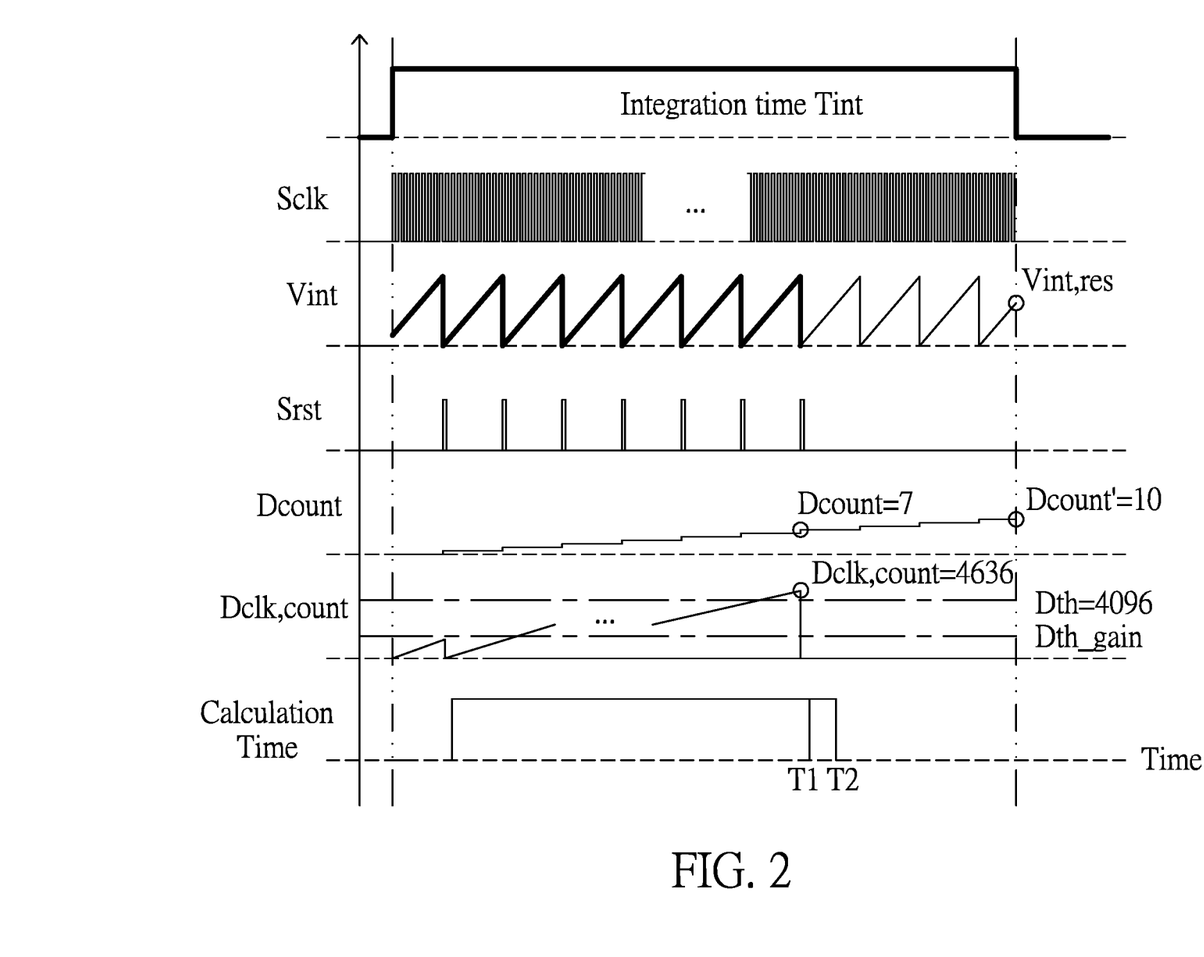
FIG. 2 is a signal timing diagram showing an integration time, a clock signal, an integration voltage, a trigger reset signal, a first count value, a second count value, and a calculation time according to an embodiment of the present disclosure.

Furthermore, reference is made to FIG. 2, which is a signal timing diagram showing an integration time, a clock signal, an integration voltage, a trigger reset signal, a first count value, a second count value, and a calculation time according to an embodiment of the present disclosure. As shown in FIG. 2, at the end of the integration time Tint, a remaining voltage Vint,res that the integration voltage Vint of the integration node Pint reaches will not be calculated by the first comparator CT1, which means that there is still an error between the original signal and the final output result, and this error affects the overall accuracy or effective bit of the sensor. Therefore, the rapid sensing value estimation circuit 1 provided by the present disclosure further estimates the error.

With further reference to FIG. 1, the rapid estimation circuit 12 can include a clock generator CG, a second counter CT2, a first digital comparator DCP1, an arithmetic module MC, and a remainder calculation module RC. The clock generator CG can be configured to generate a clock signal Sclk with a first frequency f1. The clock signal Sclk can be generated by an external signal or generated from internal of circuit, and can be synchronized through a digital circuit, which can then be used as a standard clock for determination. The second counter CT2 is electrically connected to the clock generator CG, and is configured to count the clock signal Sclk during the integration time Tint to generate and correspondingly output the second count value Dclk,count.

The second counter CT2 has a second maximum count value related to the first frequency f1 within the integration time Tint, and the second maximum count value is greater than the first maximum count value. In detail, in order to estimate the finally obtained first count value Dcount' within a time less than the integration time Tint, it is necessary to use a first frequency that has a higher reset frequency than the maximum reset frequency of the first sensing unit SD1, thereby making the second maximum count value greater than the first maximum count value. For example, the second counter CT2 can use each clock pulse as 1/8192 of the integration time Tint, so the second maximum count value can be 8192.

However, when the first count value Dcount finally obtained is prematurely estimated, the resolution will become worse than that of the integral sensing circuit 10 due to the lack of information. Therefore, in order to ensure a linearity of the original architecture, the first digital comparator DCP1 is further used to set restriction conditions. The first digital comparator DCP1 can determine whether the second count value Dclk,count exceeds the first predetermined count value Dth when the first count value Dcount increases (for example, increases by 1). It should be noted that, in order to improve the resolution of the original sensing signal, the first predetermined count value Dth can be set to 2N times the first maximum count value. For example, N can be set to 2. If the first maximum count value is 1024, the first predetermined count value Dth can be set to 2×2 times 1024, which is 4096.

In some embodiments, the fast estimation circuit 12 further includes a status check module SC, which is electrically connected to the second counter CT2 and the first digital comparator DCP1. When the first digital comparator DCP1 determines that the second count value Dclk,count exceeds the first predetermined count value Dth after the first count value Dcount increases (for example, increases by 1), the first digital comparator DCP1 will generate a corresponding determination signal, and the status check module SC can determine to use the arithmetic module MC for estimation according to the determination signal.

Furthermore, the arithmetic module MC is configured to, in response to the increasing of the first count value Dcount (for example, increases by 1) and the first digital comparator determining that the second count value Dclk,count exceeds the first predetermined count value Dth, estimate a first count value Dcount' at the end of the integration time Tint and calculate an estimated count value result Dresult1 and a remainder according to a ratio of the second maximum count value to the second count value Dclk,count and the first count value Dcount when the first count value Dcount increases and the second count value Dclk,count exceeds the first predetermined count value Dth.

For example, reference is made to FIG. 2, the clock signal Sclk can have a period of 1/8192 of the integration time Tint, and the first predetermined count value Dth is set to 4096. Every time once an entry of the first count value Dcount occurs, the arithmetic module MC determines whether the second count value Dclk,count at this time exceeds the first predetermined count value Dth, if the second count value Dclk,count at this time does not exceed the first predetermined count value Dth, the second count value Dclk,count continues to count the clock signal Sclk until the second count value Dclk,count exceeds the first predetermined count value Dth, a calculation is started by the arithmetic module MC.

On the other hand, due to delays caused by the circuit, after the integration time Tint starts, the time when the first counter CT1 starts counting may not start synchronously with the time when the integration voltage Vint of the integration node Pint is reset, or additional errors caused by unstable current or voltage may be considered at the time of initial startup, a first entry of the count value is selected to be discarded to avoid the initial turn-on error, thereby reducing an impact of the initial error on the overall final value. In other words, a portion where the first count value Dcount is 1 can be subtracted and ignored. Based on this, the second counter CT2 can be configured to start counting the clock signal Sclk after the integration time Tint starts, and after the first count value Dcount counts to 1, to generate and correspondingly output the second count value Dclk,count.

A quotient and a remainder can be calculated by the following equation (1) to estimate the first count value Dcount' and the remainder R at the end of the integration time Tint to generate the estimated count value result Dresult1:

$$Dresult1 = MaxDclk,count * Dcount / Dclk,count \quad \text{Eq (1)};$$

where MaxDclk,count is the second maximum count value, and 8192 is used in the present embodiment. Therefore, taking the embodiment of FIG. 2 as an example, when the first count value Dcount increases to 7 and when the first digital comparator DCP1 further determines that the second count value Dclk,count (4636 at this time) exceeds the first predetermined count value Dth (for example, 4096), the first digital comparator DCP1 will generate a corresponding determination signal, and the status check module SC can determine to use the arithmetic module MC to estimate based on the determination signal. At this time, the arithmetic module MC multiplies the first count value Dcount and the maximum second count value Dclk,count, as shown in FIG. 2, the first count value Dcount is 7 when the second count value Dclk,count exceeds the first predetermined count value Dth, and since the part where the first count value Dcount is 1 is ignored, the result of multiplying the first count value Dcount and the second maximum count value Dclk,count is 6*8192, which is 49152. Next, the arithmetic module MC further divides this result by the second count value Dclk,count (4636 at this time), and the estimated value result Dresult1 from equation (1) is 49152/4636, the quotient is 10, and the remainder is 2792. Therefore, it can be estimated that the first count value Dcount' at the end of the integration time Tint is 10.

Next, the steps in which the remainder calculation module RC estimates the obtained remainder will be explained. In detail, in response to the arithmetic module MC calculating the remainder (2792 in this embodiment), the remainder calculation module RC is configured to generate an estimated remainder result Dresult2 according to the remainder, thereby estimating a portion of the integration voltage Vint of the integration node Pint that has not exceeded the first reference voltage VREF to be counted by the first counter CT1 at the end of the integration time Tint.

In this case, the estimated remainder result Dresult2 is obtained by dividing the remainder 2792 by the second count value Dclk,count. Therefore, the estimated remainder result Dresult2 is 2792/4636, which is about 0.602. This means that the rapid sensing value estimation circuit provided by the present disclosure can calculate the estimated remainder result to exceed the number of bits that can be calculated by the original sensing. It can further provide a value below the decimal point under a limit of an integer count value provided by the original first counter CT1, for example, a three-digit resolution below the decimal point can be provided.

As shown in FIG. 2, the rapid estimation circuit 12 can calculate the quotient and the remainder at time T1 to obtain the estimated count value result Dresult1, and at time T2, the remainder can be calculated to obtain the estimated remainder result Dresult2. Therefore, the overall integration time Tint can be lower than the original one. In practical operation, an interval between time T1 and T2 can be reduced to the time of few clock pulses. The present disclosure calculates the signal change trend in a short time and estimates the result at the end of the complete integration time. That is, it can save the time of waiting for the circuit to perform integration, and the integration time that can be saved for each calculation will vary with setting of related parameters and demands for resolution.

On the other hand, if the first sensing signal S11 generated by the first sensing unit SD1 is extremely weak, a case in which the second count value Dclk,count is counted to a very high value while the first count value Dcount is still zero occurs, which in turn leads to an increase in estimated time or even unpredictable conditions. Therefore, the present disclosure sets another restriction by setting the second digital comparator DCP2, and determines whether to amplify the first sensing signal S11 generated by the first sensing unit SD1 based on the restriction before performing calculation.

In some embodiments, the rapid sensing value estimation circuit 1 further includes a signal amplifier CA connected between the first sensing unit SD1 and the integration node Pint. The signal amplifier CA can be, for example, a current amplifier for amplifying the first sensing signal S11, but is not limited thereto. In practice, a type of signal amplifier CA used can be determined according to a type of the first sensing unit SD1.

On the other hand, the rapid estimation circuit 12 further includes a second digital comparator DCP2 and a digital controller DC. The second digital comparator DCP2 can determine whether the first count value Dcount is zero when the second count value Dclk,count exceeds a second predetermined count value Dth_gain within the integration time Tint and when the second count value Dclk,count increases.

The digital controller DC is configured to, in response to the second digital comparator DCP2 determining that when the second count value Dclk,count exceeds the second predetermined count value Dth_gain and the first count value Dcount is zero, output a first control signal Sc1 to control the signal amplifier CA to amplify the first sensing signal S11. The second predetermined count value Dth_gain can be set to be smaller than the first predetermined count value Dth. For example, the second predetermined count value Dth_gain can be ⅓ or ¼ of the first predetermined count value Dth. Therefore, even if the first sensing signal S11 is weak, it can still be determined by the second digital comparator DCP2 in an early stage of the integration time Tint, such that the first sensing signal S11 can be quickly amplified and then be used for estimation.

In some embodiments, the status check module SC can be further electrically connected to a second digital comparator DCP2 and a digital controller DC. When the second digital comparator DCP2 determines the second count value Dclk, count exceeds the second predetermined count value Dth_ gain and the first count value Dcount is zero, the second digital comparator DCP2 generates a corresponding determination signal, and the status check module SC can determine to configure the digital controller DC to control the signal amplifier CA to amplify the first sensing signal S11 according to the determination signal.

In addition, the rapid estimation circuit 12 can further include a first register REG1, a second register REG2, and a third register REG3. The first register REG1 is connected to the first digital comparator DCP1 and configured to store the first predetermined count value Dth. The second register REG2 is connected to the second digital comparator DCP2 and configured to store the second predetermined count value Dth_gain. The third register REG3 is connected to the arithmetic module MC and the remainder calculation module RC, and configured to store the estimated count value result Dresult1 and the estimated remainder result Dresult2.

On the other hand, the rapid estimation circuit 12 can further include a setter ST for the user to set the first frequency f1 of the clock generator CG, such that the required first predetermined count value Dth can be calculated according to the set first frequency f1. The user can increase the first frequency f1 according to the demand for resolution, and correspondingly obtain the estimated count value result Dresult1 and the estimated remainder result Dresult2 corresponding to higher resolution.

In conclusion, the rapid sensing value estimation circuit and method thereof provided by the present disclosure can calculate a change trend density of an original output signal in a short time, which can estimate a result at the end of the full integration time in advance. Further, since a signal with a higher frequency is used as basis of the calculation, the calculation can be more accurate than the original architecture.

Furthermore, the rapid sensing value estimation circuit provided by the present disclosure can use an original count value result as the signal output in various applications without break a circuit structure of the original sensor and the integration sensing circuit, and can estimate results in advance under the premise of maintaining the linearity of the original architecture, while increasing a resolution of the original sensing signal. Furthermore, in addition to improving the resolution of the overall signal, the effect can be significantly improved for weaker input signals.

Figure 3:
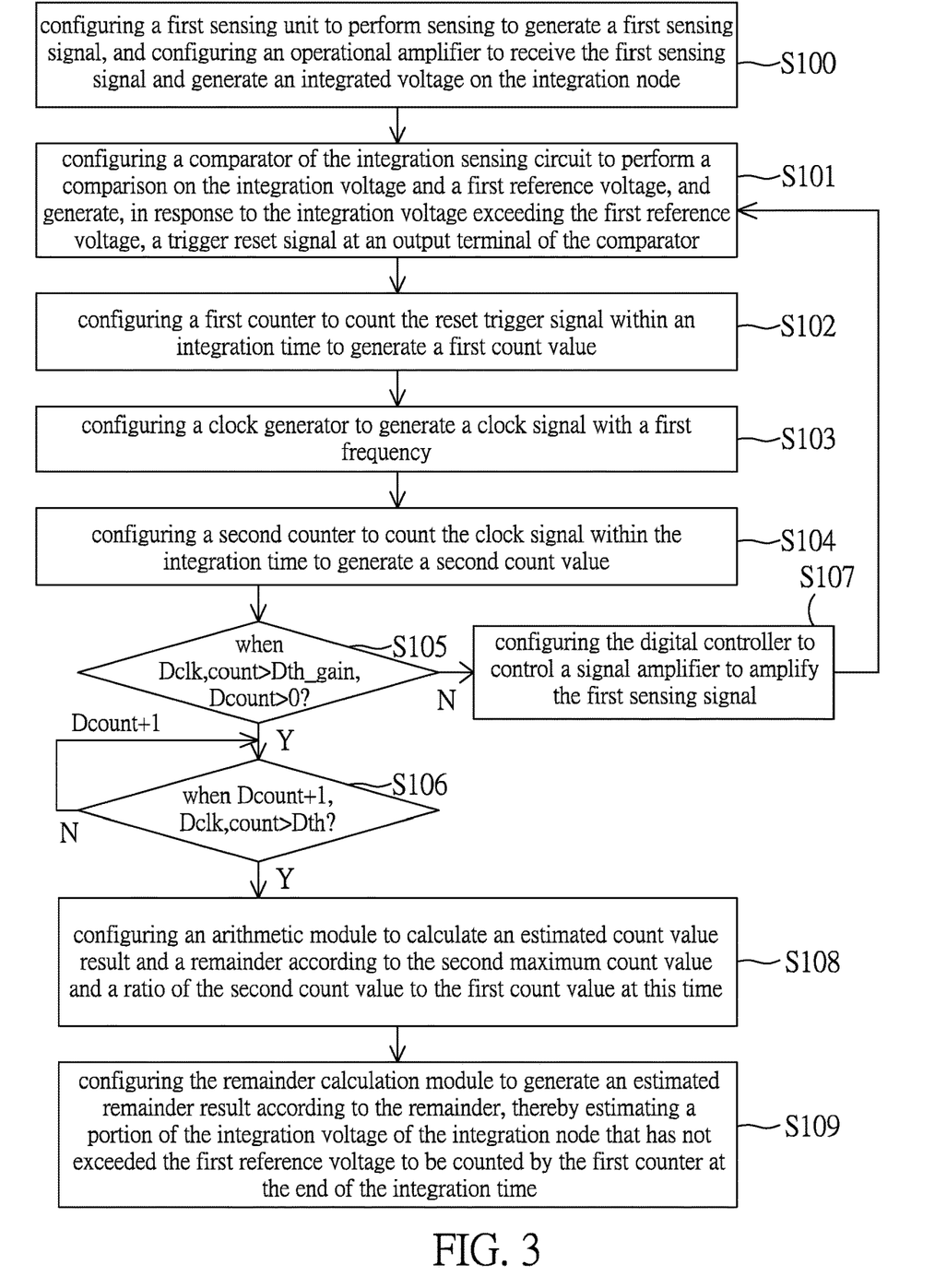
FIG. 3 is a flowchart of a rapid sensing value estimation method according to an embodiment of the present disclosure.

In addition, reference can be further made to FIG. 3, which is a flowchart of a rapid sensing value estimation method according to an embodiment of the present disclosure. As shown in FIG. 3, the present disclosure further provides a rapid sensing value estimation method, which is suitable for the rapid sensing value estimation circuit of the foregoing embodiment, and the method includes the following steps:

Step S100: configuring a first sensing unit to perform sensing to generate a first sensing signal, and configuring an operational amplifier to receive the first sensing signal and generate an integrated voltage on the integration node.

Step S101: configuring a comparator of the integration sensing circuit to perform a comparison on the integration voltage and a first reference voltage, and generate, in response to the integration voltage exceeding the first reference voltage, a trigger reset signal at an output terminal of the comparator.

Step S102: configuring a first counter to count the reset trigger signal within an integration time to generate a first count value.

Step S103: configuring a clock generator to generate a clock signal with a first frequency.

Step S104: configuring a second counter to count the clock signal within the integration time to generate a second count value.

Step S105: configuring a second digital comparator of the rapid estimation circuit to determine whether the first count value is zero when the second count value exceeds a second predetermined count value within the integration time and when the second count value increased. If the first count value is zero when the second count value exceeds a second predetermined count value within the integration time and when the second count value increased, the method proceeds to step S106: configuring a first digital comparator to determine whether the second count value exceeds the first predetermined count value when the first count value increases.

If the second digital comparator determines that the first count value is not zero when the second count value exceeds a second predetermined count value within the integration time and when the second count value increased, the method proceeds to step S107: configuring the digital controller to control a signal amplifier to amplify the first sensing signal, and the method returns to step S101.

If the first digital comparator determines that the second count value does not exceed the first predetermined count value when the first count value increases in the step S106, then the step S106 is repeated after waiting for the first count value to increase. If the first digital comparator determines that the second count value exceeds the first predetermined count value when the first count value increases in the step S106, the method proceeds to step S108: configuring an arithmetic module to calculate an estimated count value result and a remainder according to the second maximum count value and a ratio of the second count value to the first count value at this time. The estimated count value result is used to estimate the first count value at an end of the integration time.

In response to the remainder being calculated by the arithmetic module, the method proceeds to step S109: configuring the remainder calculation module to generate an estimated remainder result according to the remainder, thereby estimating a portion of the integration voltage of the integration node that has not exceeded the first reference voltage to be counted by the first counter at the end of the integration time.

In conclusion, the rapid sensing value estimation circuit and method thereof provided by the present disclosure can calculate a change trend density of an original output signal in a short time, which can estimate a result at the end of the full integration time in advance. Further, since a signal with a higher frequency is used as basis of the calculation, the calculation can be more accurate than the original architecture.

Therefore, the rapid sensing value estimation circuit and method thereof provided by the present disclosure can use an original count value result as the signal output in various applications without break a circuit structure of the original sensor and the integration sensing circuit, and can estimate results in advance under the premise of maintaining the linearity of the original architecture, while increasing a resolution of the original sensing signal. Furthermore, in addition to improving the resolution of the overall signal, the effect can be significantly improved for weaker input signals.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A rapid sensing value estimation circuit, comprising:
   a first sensing unit configured to perform sensing to generate a first sensing signal;
   an integration sensing circuit electrically connected to the first sensing unit and including:
   an operational amplifier having:
   a first input terminal electrically connected to the first sensing unit, and connected to an output terminal of the operational amplifier through an integration capacitor; and
   a second input terminal grounded, wherein the output terminal of the operational amplifier is an integration node, and the operational amplifier receives the first sensing signal and generates an integration voltage on the integration node;
   a comparator having a first input terminal electrically connected to the integration node, and a second input terminal electrically connected to a first reference voltage, wherein in response to the integration voltage of the integration node exceeding the first reference voltage, the comparator is configured to generate a trigger reset signal at the output terminal of the comparator, wherein the trigger reset signal is used to reset the integration voltage; and
   a first counter configured to count the trigger reset signal within an integration time to generate a first count value and correspondingly output a first count signal, wherein the first counter has a first maximum count value within the integration time; and
   a rapid estimation circuit including:
   a clock generator configured to generate a clock signal having a first frequency;
   a second counter electrically connected to the clock generator and configured to count the clock signal within the integration time to generate a second count value, and correspondingly output a second count signal, wherein the second counter has a second maximum count value related to the first frequency within the integration time, and the second maximum count value is greater than the first maximum count value;
   a first digital comparator configured to determine whether the second count value exceeds a first predetermined count value when the first count value increased;
   an arithmetic module configured to, in response to an increasing of the first count value and the first digital comparator determining that the second count value exceeds the first predetermined count value, calculate an estimated count value result and a remainder according to the second maximum count value and a ratio of the second count value to the first count value, wherein the estimated count value result is used to estimate the first count value at an end of the integration time; and
   a remainder calculation module configured to, in response to the remainder being calculated by the arithmetic module, generate an estimated remainder result according to the remainder, thereby estimating a portion of the integration voltage of the integration node that has not exceeded the first reference voltage to be counted by the first counter at the end of the integration time.

2. The rapid sensing value estimation circuit according to claim 1, further comprising a signal amplifier connected between the first sensing unit and the integration node, wherein the rapid estimation circuit further includes:
   a second digital comparator configured to determine whether the first count value is zero when the second count value exceeds a second predetermined count value within the integration time and when the second count value increased; and
   a digital controller configured to, in response to the second digital comparator determining that the first count value is zero when the second count value exceeds the second predetermined count value, output a first control signal to control the signal amplifier to amplify the first sensing signal, wherein the second predetermined count value is less than the first predetermined count value.

3. The rapid sensing value estimation circuit according to claim 1, wherein the first predetermined count value is at least greater than 2N times the first maximum count value, and N is a positive integer greater than zero.

4. The rapid sensing value estimation circuit according to claim 2, wherein the rapid estimation circuit further includes a status check module electrically connected to the second counter, the first digital comparator, and the second digital comparator and the digital controller, and configured to receive determination results generated by the first digital comparator and the second digital comparator, respectively, to determine to control the digital controller or the arithmetic module.

5. The rapid sensing value estimation circuit according to claim 1, wherein the rapid estimation circuit further includes:
a first register connected to the first digital comparator and configured to store the first predetermined count value;
a second register connected to the second digital comparator and configured to store the second predetermined count value; and
a third register connected to the arithmetic module and the remainder calculation module, and configured to store the estimated count value result and the estimated remainder result.

6. The rapid sensing value estimation circuit according to claim 1, wherein a calculation of the estimated count value result includes multiplying the second maximum count value by the first count value, and dividing by the second count value, thereby obtaining a quotient used as the estimated count value result and the remainder, and the estimated remainder result is obtained by dividing the remainder by the second count value.

7. The rapid sensing value estimation circuit according to claim 1, wherein the second counter is further configured to start counting the clock signal after the first count value reaches 1 after the integration time starts, to generate the second count value, and correspondingly output the second count signal,
wherein the arithmetic module is configured to, in response to the increasing of the first count value and the first digital comparator determining that the second count value exceeds the first predetermined count value, calculate the estimated count value result and the remainder according to a ratio of the second maximum count value to the second count value, and the first count value minus 1, wherein the used first count value is obtained when the second count value exceeding the first predetermined count value.

8. A rapid sensing value estimation method, comprising the following steps:
configuring a first sensing unit to perform sensing to generate a first sensing signal;
configuring an operational amplifier of an integration sensing circuit to receive the first sensing signal and generate an integral voltage on an integral node;
configuring a comparator of the integration sensing circuit to perform a comparison on the integration voltage and a first reference voltage, and generate, in response to the integration voltage exceeding the first reference voltage, a trigger reset signal at an output terminal of the comparator, wherein the trigger reset signal is used to reset the integration voltage;
configuring a first counter of the integration sensing circuit to count the trigger reset signal within an integration time to generate a first count value and correspondingly output a first count signal, wherein the first counter has a first maximum count value within the integration time;
configuring a clock generator of a rapid estimation circuit to generate a clock signal having a first frequency;
configuring a second counter of the rapid estimation circuit to count the clock signal within the integration time to generate a second count value, and correspondingly output a second count signal, wherein the second counter has a second maximum count value related to the first frequency within the integration time, and the second maximum count value is greater than the first maximum count value;
configuring a first digital comparator of the rapid estimation circuit to determine whether the second count value exceeds a first predetermined count value when the first count value increased;
configuring an arithmetic module of the rapid estimation circuit to, in response to an increasing of the first count value and the first digital comparator determining that the second count value exceeds the first predetermined count value, calculate an estimated count value result and a remainder according to the second maximum count value and a ratio of the second count value to the first count value, wherein the estimated count value result is used to estimate the first count value at an end of the integration time; and
configuring a remainder calculation module to, in response to the remainder being calculated by the arithmetic module, generate an estimated remainder result according to the remainder, thereby estimating a portion of the integration voltage of the integration node that has not exceeded the first reference voltage to be counted by the first counter at the end of the integration time.

9. The rapid sensing value estimation method according to claim 8, further comprising:
configuring a second digital comparator of the rapid estimation circuit to determine whether the first count value is zero when the second count value exceeds a second predetermined count value within the integration time and when the second count value increased; and
configuring a digital controller of the rapid estimation circuit to, in response to the second digital comparator determining that the first count value is zero when the second count value exceeds the second predetermined count value, output a first control signal to control the signal amplifier to amplify the first sensing signal,
wherein the second predetermined count value is less than the first predetermined count value.

10. The rapid sensing value estimation method according to claim 8, wherein the first predetermined count value is at least greater than 2N times the first maximum count value, and N is a positive integer greater than zero.

11. The rapid sensing value estimation method according to claim 9, further comprising: configuring a status check module of the rapid estimation circuit to receive determination results generated by the first digital comparator and the second digital comparator, respectively, to determine to control the digital controller or the arithmetic module.

12. The rapid sensing value estimation method according to claim 8, further comprising:
- configuring a first register of the rapid estimation circuit to store the first predetermined count value;
- configuring a second register of the rapid estimation circuit to store the second predetermined count value; and
- configuring a third register of the rapid estimation circuit to store the estimated count value result and the estimated remainder result.

13. The rapid sensing value estimation method according to claim 8, wherein a calculation of the estimated count value result includes multiplying the second maximum count value by the first count value, and dividing by the second count value, thereby obtaining a quotient used as the estimated count value result and the remainder, and the estimated remainder result is obtained by dividing the remainder by the second count value.

14. The rapid sensing value estimation method according to claim 8, further comprising:
- configuring the second counter to start counting the clock signal after the first count value reaches 1 after the integration time starts, to generate the second count value, and correspondingly output the second count signal; and
- configuring the arithmetic module to, in response to the increasing of the first count value and the first digital comparator determining that the second count value exceeds the first predetermined count value, calculate the estimated count value result and the remainder according to a ratio of the second maximum count value to the second count value, and the first count value minus 1, wherein the used first count value is obtained when the second count value exceeding the first predetermined count value.

* * * * *